US006985129B2

(12) United States Patent
Anzai et al.

(10) Patent No.: US 6,985,129 B2

(45) Date of Patent: Jan. 10, 2006

(54) VIDEO DISPLAY DEVICE

(75) Inventors: Katsuya Anzai, Gifu (JP); Ryoichi Yokoyama, Ohgaki (JP)

(73) Assignee: Sanyo Electric Co., Ltd., (JP)

( * ) Notice: Subject to any disclaimer, the term of this patent is extended or adjusted under 35 U.S.C. 154(b) by 293 days.

(21) Appl. No.: 10/093,988

(22) Filed: Mar. 7, 2002

(65) Prior Publication Data

US 2002/0154110 A1 Oct. 24, 2002

(51) Int. Cl.
*G09G 3/36* (2006.01)

(52) U.S. Cl. .......................................... 345/98; 345/99

(58) Field of Classification Search ................ 345/204, 345/87, 94, 98, 99, 100, 212

See application file for complete search history.

(56) References Cited

U.S. PATENT DOCUMENTS 6,300,813 B1 * 10/2001 Matsui ....................... 327/288
6,462,726 B1 * 10/2002 Hamada et al. ............... 345/98
6,476,789 B1 * 11/2002 Sakaguchi et al. .......... 345/100
2001/0022573 A1 * 9/2001 Sasaki et al. ............... 345/100

FOREIGN PATENT DOCUMENTS

JP 406018617 * 1/1994

* cited by examiner

*Primary Examiner*—Dennis-Doon Chow
(74) *Attorney, Agent, or Firm*—Cantor Colburn LLP

(57) ABSTRACT

On a substrate (10), one or more inverter circuits for adjusting delay time are provided between an external clock input section (T1, T2) to which a clock signal CKH1 or CKH2 is externally input and a sampling signal generating circuit (shift register). Of the inverter circuits, only necessary inverter circuits are selected and connected, thereby delaying the sampling timing for a video signal. The connection between the inverter circuit and the signal path is achieved simply by changing a connection line pattern mask in accordance with the number of inverter circuits to be connected, and without changing other manufacturing processes.

10 Claims, 9 Drawing Sheets

VIDEO DISPLAY DEVICE

BACKGROUND OF THE INVENTION

1. Field of the Invention

The present invention relates to a video display device, more specifically to timing control of a sampling signal for a video signal based on a clock signal in a driving circuit of a video display device.

2. Description of Related Art

In recent years, there has been a strong commercial demand for video display devices, especially for use as monitors for devices such as a portable television and a mobile telephone. Further, display devices used for such a purpose have been actively researched and developed in attempts to satisfy the strong demand for display devices which are small, lightweight, and which consume less power.

FIG. 1 is an equivalent circuit diagram of a conventional liquid crystal display device, and FIG. 2 is a timing chart showing the driving of such a liquid crystal display device.

Referring to FIG. 1, a liquid crystal display panel P has the following structure. On an insulating substrate 10, a plurality of gate signal lines 51 connected to a gate driver 50 which supplies a gate signal, and a plurality of drain signal lines 61 are provided. A sampling transistor SPt1, SPt2 . . . SPtn turns on according to the timing of a sampling pulse output from a drain driver 60 which supplies a drain signal. In accordance with the actuation of the sampling transistor, a data signal (video signal) Sig is supplied from a video signal line 62 to the drain signal lines 61. Near each intersection of signal lines 51, 61, a TFT 70 is connected to the signal lines 51, 61 and a display electrode 80 is connected to the TFT 70.

Further, an LSI for driving the panel is provided on an external circuit substrate separately from the insulating substrate 10.

Clock signals CKH1 and CKH2 are supplied via external clock input sections T1 and T2, respectively, from the external panel driving LSI. These clock signals CKH1 and CKH2 are of opposite phases, and serve as a reference signal for generating a timing signal which determines the timing at which each of the sampling transistors SPt1, SPt2, SPt3 . . . latches a video signal.

Further, a start signal STV for a vertical driver and a start signal STH for a horizontal driver are also supplied from the panel driving LSI to the gate driver 50 and the drain driver 60, respectively. A data signal Sig is input to the video signal line 62.

The externally supplied clock signals, the external clock signals CKH1 and CKH2, are first input to level shifters (L/S), respectively, where the voltage of the signal is boosted from 0~3 V to 0~8 V, for example. The output signal is then input to a shaping inverter circuit 102, and is further input as a clock signal into each of shift registers which form the drain driver 60 via a buffer circuit 101.

Each shift register is composed of an inverter circuit and a clocked inverter circuit. A clock signal is sequentially passed to the next stage based on the horizontal direction start signal STH, so that each shift register generates a sampling pulse.

An externally input video signal is sampled by a sampling TFT based on the sampling pulse, and is then output to the corresponding drain signal line 61. More specifically, the sampling TFT SPt becomes ON in accordance with a sampling signal generated based on the start signal STH, and the video signal on the video signal line 62 is supplied to the drain signal line 61.

Further, the TFT 70 turns on when a gate signal is input from the gate signal line 51 to a gate electrode 13 thereof. This causes a drain signal to be applied to the display electrode 80 via the TFT 70. Simultaneously, a drain signal is also applied to a storage capacitor 85 via the TFT 70 so as to hold the voltage applied to the display electrode 80 for one field period. One electrode of the storage capacitor 85 is connected to the source 11*s* of the TFT 70 and to the other electrode a potential common for all the display pixels P11, P12, P13 . . . P21, P22, P23 . . . is applied.

The storage capacitor 85 is provided for the following reasons. When the gates 13 of the TFT 70 are opened so that the drain signal is applied to the liquid crystal 21, the voltage of the signal must be held for one field period. However, the voltage would be gradually lowered with time when only the liquid crystal 21 is provided, which results in flicker and unevenness in display thereby disenabling desirable display. The storage capacitor 85 is therefore provided to hold the voltage for one field period.

By supplying a voltage which has been applied to the display electrode 80 to the liquid crystal 21, the liquid crystal 21 orients in accordance with the applied voltage, thereby creating a display.

In conventional liquid crystal devices, however, the characteristics of each circuit, for example the inverter circuits 101, 102, may change due to variations in the manufacturing process conditions or the like. This further causes a change in the timing for sampling a video signal based on the clock signal. Namely, the sampling timing may sometimes be advanced or delayed.

As a result, the conventional liquid crystal display devices suffer from the following problems. Specifically, there is a possibility that a data signal is sampled by the sampling TFT SPt before the video signal line 62 is sufficiently charged to the potential of the video signal Sig, and the voltage of the sampled signal is supplied to each drain signal line 61. In such a case, an insufficient voltage is applied to the display electrode 80 which receives a drain signal from the drain line 61, and this disadvantageously degrades the display quality of the device.

FIG. 2 is a timing chart at points A, B, and C in FIG. 1.

As described above, a horizontal start signal STH is shifted within the drain driver 60 so that a sampling timing signal STH1, STH2 . . . is generated and output from each stage of the drain driver 60 (point A). These timing signals pass through various inverters so that they have the same phase but different polarities, and are then applied to the sampling TFT SPt1 (points B and C). However, when the timing signals for turning the sampling TFT SPt1 on are output, for example, at the timing as indicated in FIG. 2 (B, C) due to the characteristics change of the inverter circuit 101 or the like, the video signal S11 is sampled at timing where the potential of the video signal S11 is not yet established on the video signal line 62. In such a case, display quality is degraded.

One possible way of solving such a timing shift for sampling the video signal is to adjust the phases of the clock signals CKH1 and CKH2. More specifically, such phase adjustment refers to adjusting the delay time for the clock signals CKH1, CKH2, which can be achieved by changing the number of inverter circuits in the clock input section. However, because the inverter circuit cannot be changed once the various circuits have been formed, new pattern masks for the respective manufacturing processes must be further prepared for providing an additional inverter circuit. Specifically, it is necessary to additionally prepare all the pattern masks required at the various process steps for forming an inverter circuit including a process for forming an island shape active layer of the TFT through a process for forming the source and drain electrodes and the lines of the TFT. This method is disadvantageous in that for the cost of creating such additional pattern masks is great.

SUMMARY OF THE INVENTION

The present invention was conceived in view of the above-described problems in the related art and provides a video display device capable in which the timing at which a sampling transistor samples a video signal can be preferably adjusted in a simple manner, thereby providing desirable display, and without increasing cost.

In accordance with one aspect of the present invention, there is provided a display device in which a display signal externally transferred in sequence is sampled based on an external clock signal and is supplied to each of a plurality of pixels arranged in a matrix for causing each pixel to generate a display, said display device comprising a sampling signal generating circuit for generating a sampling signal used for sampling said display signal, based on said external clock signal, and at least one clock delaying circuit disposed between said sampling signal generating circuit and a terminal for supplying said external clock signal, said at least one clock delaying circuit having a function of delaying said external clock signal, wherein said at least one clock delaying circuit is connected to a signal transmission line which is provided for supplying said external clock signal to said sampling signal generating circuit, by forming the signal transmission line and a connection line connecting to the signal transmission line using a pattern mask in accordance with the required number of connection for the delaying circuit in the process for forming the signal transmission line and the connection line.

In accordance with another aspect of the present invention, in the above display device, the clock delaying circuit is an inverter circuit formed by an n-type thin film transistor and a p-type thin film transistor which are connected in a complementary manner, and the n-type thin film transistor and the p-type thin film transistor forming one inverter circuit are arranged such that active layers of the n-type and p-type transistors are spaced at an interval which is larger than the width of the signal transmission line.

In accordance with another aspect of the present invention, in the above display device, a switching element is formed in each of the pixels, and an electrode and a line connected with the switching element are formed from the same material as that used for the signal transmission line and the connection line of the at least one clock delaying circuit.

By employing the present invention, it is possible to provide a video display device in which the timing at which a sampling transistor samples a video signal can be properly adjusted in a simple manner and without increasing cost, thereby performing desirable display.

In accordance with another aspect of the present invention, there is provided a display device in which a display signal externally transferred in sequence is sampled based on an external clock signal and is supplied to each of a plurality of pixels arranged in a matrix for causing each pixel to generate a display, said display device comprising a sampling signal generating circuit for generating a sampling signal used for sampling the display signal, based on said external clock signal, and at least one clock delaying circuit disposed between the sampling signal generating circuit and a terminal for supplying the external clock signal, the at least one clock delaying circuit having a function of delaying the external clock signal, wherein at least one of the at least one clock delaying circuits is insulated from a signal transmission line which is provided for supplying said external signal to the sampling signal generating circuit.

In accordance with still another aspect of the present invention, in the above display devices, the signal transmission line may be arranged such that the signal transmission line passes though within a region where the at least one clock delaying circuit which is not electrically connected with the signal transmission line is formed, with the signal transmission line remaining insulated from said delaying circuit.

In accordance with a further aspect of the present invention, in the above display devices, the clock delaying circuit is an inverter circuit formed by an n-type thin film transistor and a p-type thin film transistor which are connected in a complementary manner, and the n-type thin film transistor and the p-type thin film transistor forming one inverter circuit are arranged such that active layers of the n-type and p-type transistors are spaced at an interval which is larger than the width of the signal transmission line.

In accordance with a still further aspect of the present invention, in the above display devices, the clock delaying circuit is an inverter circuit formed by an n-type thin film transistor and a p-type thin film transistor which are connected in a complementary manner, and in a region where the clock delaying circuit which is insulated from the signal transmission line is formed, the signal transmission line is arranged in an interval between active layers which are spaced from each other, of the n-type thin film transistor and the p-type thin film transistor forming one inverter circuit.

In accordance with a further aspect of the present invention, in the above display devices, the clock delaying circuit is an inverter circuit formed by an n-type thin film transistor and a p-type thin film transistor which are connected in a complementary manner, and the n-type thin film transistor and the p-type thin film transistor for the at least one clock delaying circuit which is not electrically connected with the signal transmission line are connected with a low voltage side power source line and a high voltage side power source line, respectively.

In this manner, a transistor which is not connected with the signal path is connected to the power source line. Accordingly, it is possible to prevent the transistor from entering an electrically floating state so that, even when there is a delay circuit which is not connected to the signal path, the effect such an unconnected circuit will have on other circuit elements can be reduced significantly.

In accordance with another aspect of the present invention, there is provided a display device in which a display signal externally transferred in sequence is sampled based on an external clock signal and is supplied to each of pixels arranged in a matrix for causing each pixel to perform display, said display device comprising a sampling signal generating circuit for generating a sampling signal used for sampling the display signal, based on the external clock signal, and at least one clock delaying circuit having a function of delaying the external clock signal, the at least one clock delaying circuit being connected with a signal transmission line between the sampling signal generating circuit and a terminal for supplying the external clock signal, wherein in each of the clock delaying circuits, a plurality of elements forming each circuit are spaced at an interval which is larger than the width of the signal transmission line.

In accordance with a further aspect of the present invention, in the above display devices, the clock delaying circuit is an inverter circuit formed by an n-type thin film transistor and a p-type thin film transistor which are connected in a complementary manner, and the n-type thin film transistor and the p-type thin film transistor forming one inverter circuit are arranged such that active layers of the n-type and p-type transistors are spaced at an interval which is larger than the width of the signal transmission line.

BRIEF DESCRIPTION OF THE DRAWINGS

These and other objects of the invention will be explained in the description below, in connection with the accompanying drawings, in which.

DETAILED DESCRIPTION OF THE PREFERRED EMBODIMENTS

Preferred embodiments of a video display device according to the present invention will be described in further detail with reference to the accompanying drawings.

Figure 3:
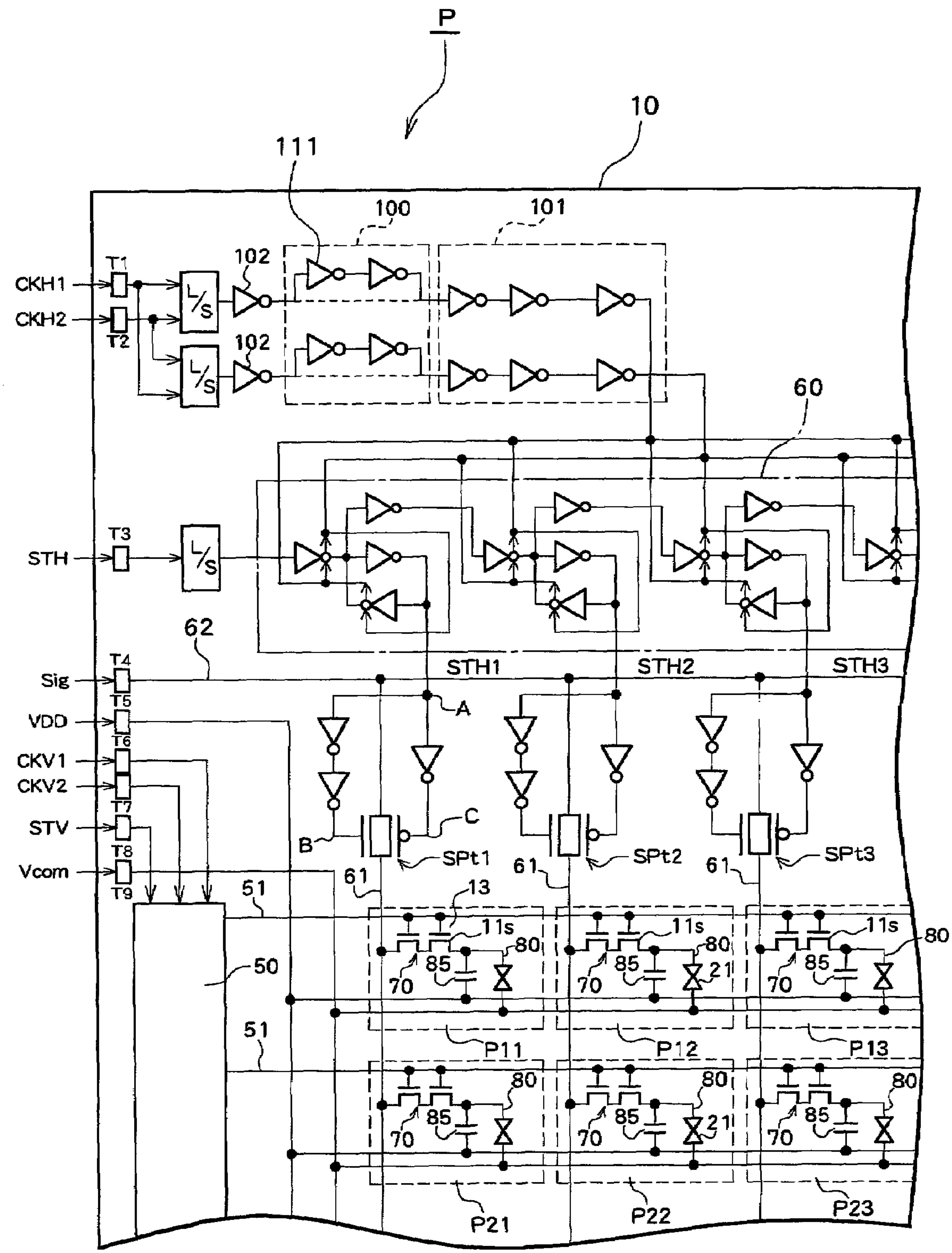
FIG. 3 is an equivalent circuit diagram illustrating application of a video display device of the present invention to a liquid crystal display device.
Figure 4:
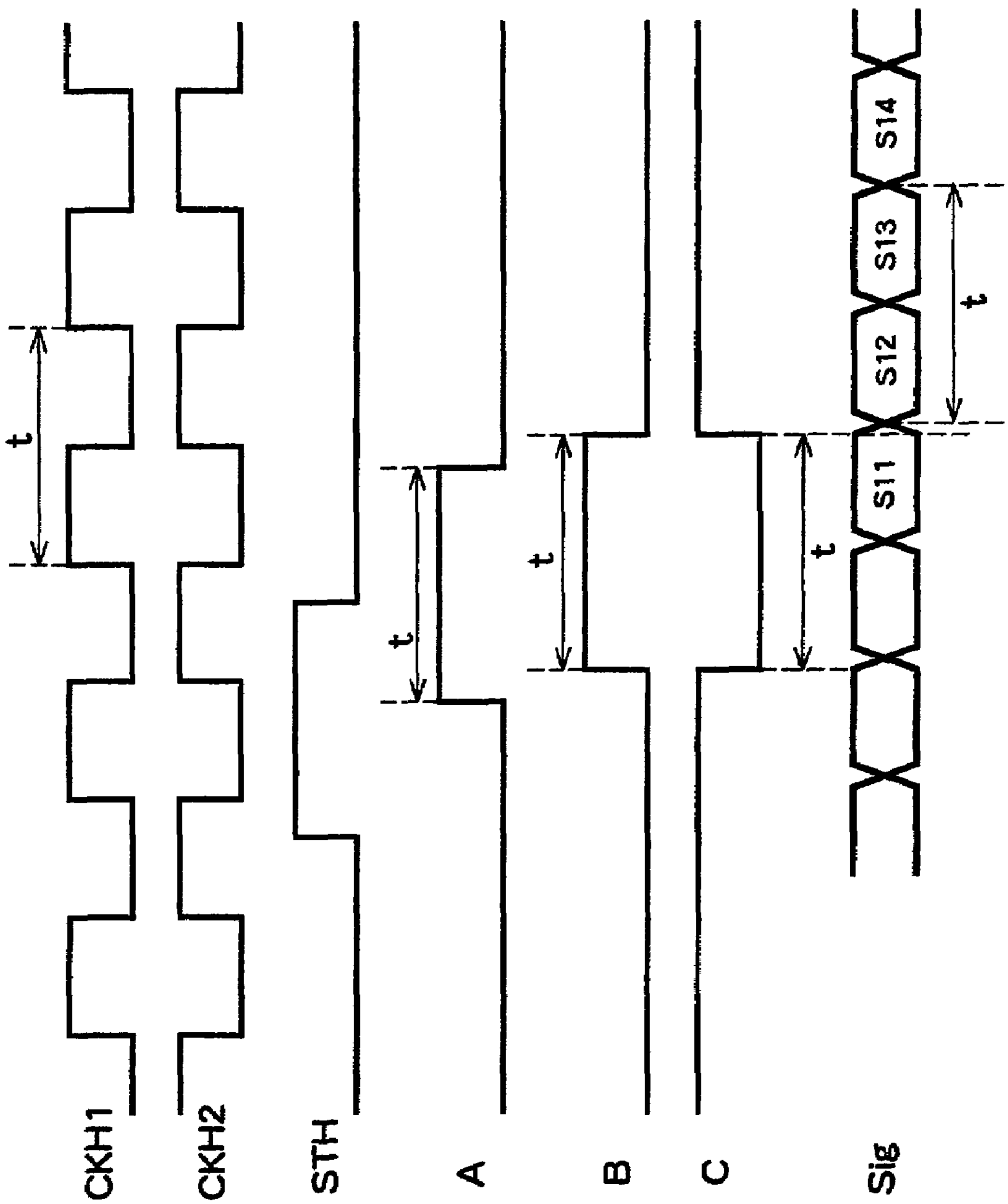
FIG. 4 is a timing chart for a video display device according to the present invention.

FIG. 3 is an equivalent circuit diagram showing an example wherein the video display device of the present invention is applied to a liquid crystal display device. FIG. 4 is a timing chart showing driving of the liquid crystal display device.

Has Referring to FIG. 3, a liquid crystal display panel P is driven based on signals supplied from an externally provided LSI for driving the panel, which is separately provided from the liquid crystal display panel P, and from various signal terminals.

The liquid crystal display panel P includes a plurality of gate signal lines 51 which are disposed in the row (horizontal) direction and connected with a gate driver 50 which supplies a gate signal and a plurality of drain signal lines 61 which are disposed in the column (vertical) direction and connected with a drain driver 60 which supplies a drain signal. In the vicinity of each of intersections between both signal lines 51, 61, a TFT 70 which is a switching element in the display region is disposed. The liquid crystal display panel P further includes a plurality of display pixels P11, P12, P13 . . . which are arranged in a matrix. Each of these display pixels is formed in each region defined by the gate signal line 51 and the drain signal line 61. Rise and fall of the liquid crystal 21 is controlled by the voltage applied to the display electrode 80 connected to the TFT 70.

Further, terminals T1~T9 are provided to the liquid crystal display panel P for applying an external clock signal for allowing scanning by each of the drivers 51, 61, a data signal, an opposing electrode voltage, a voltage for driving each driver, and a voltage for driving a signal storage circuit, all of which are supplied from the external panel driving LSI.

Thus, the external panel driving LSI generates an external clock signal CKV1, CKV2, CKH1, or CKH2 for operating the above-described drivers 50 and 60, a timing signal (STV, STH), and a display data signal (Sig). Further, the external clock signal, the opposing electrode voltage (Vcom), and a driver power source or the like are supplied from the respective signal terminals T1~T9 to the liquid crystal display panel P.

Shift registers together form the drain driver 60. Each of the shift registers is composed of an inverter circuit and a clocked inverter circuit. A horizontal direction start signal STH is sequentially transferred to the shift register at the next stage based on the clock signals CKH1, CKH2, so that a sampling pulse is output from each shift transistor. The clocked inverter structure may be replaced by an inverter circuit and a transfer gate.

The display device shown in FIG. 3 is characterized in the provision of a plurality of inverter circuits 111 functioning as a delay time adjusting circuit (a delay circuit 100) which adjusts the sampling timing, between the external clock signal input sections T1 and T2 and the shift register (a sampling signal generating circuit) 60.

A method of driving the video display device of the present invention will next be described.

FIG. 4 is a timing chart at the respective points in the liquid crystal display device of FIG. 3.

Based on the external clock signals CKH1 and CKH2 having one period t, the shift register transfers a start signal STH, and also outputs a sampling signal whose selection level is equal to the "t" period to the corresponding sampling TFT SPt1, SPt2, SPt3 . . . (see A in FIG. 4). The sampling TFT SPt in turn samples a video signal at timing in accordance with the sampling signal.

The sampling of a video signal by the sampling TFT is performed at timing B and C when the video signal line 62 is charged sufficiently that the potential of the video signal line 62 becomes equivalent to the original potential of the video signal S11.

Figure 1:
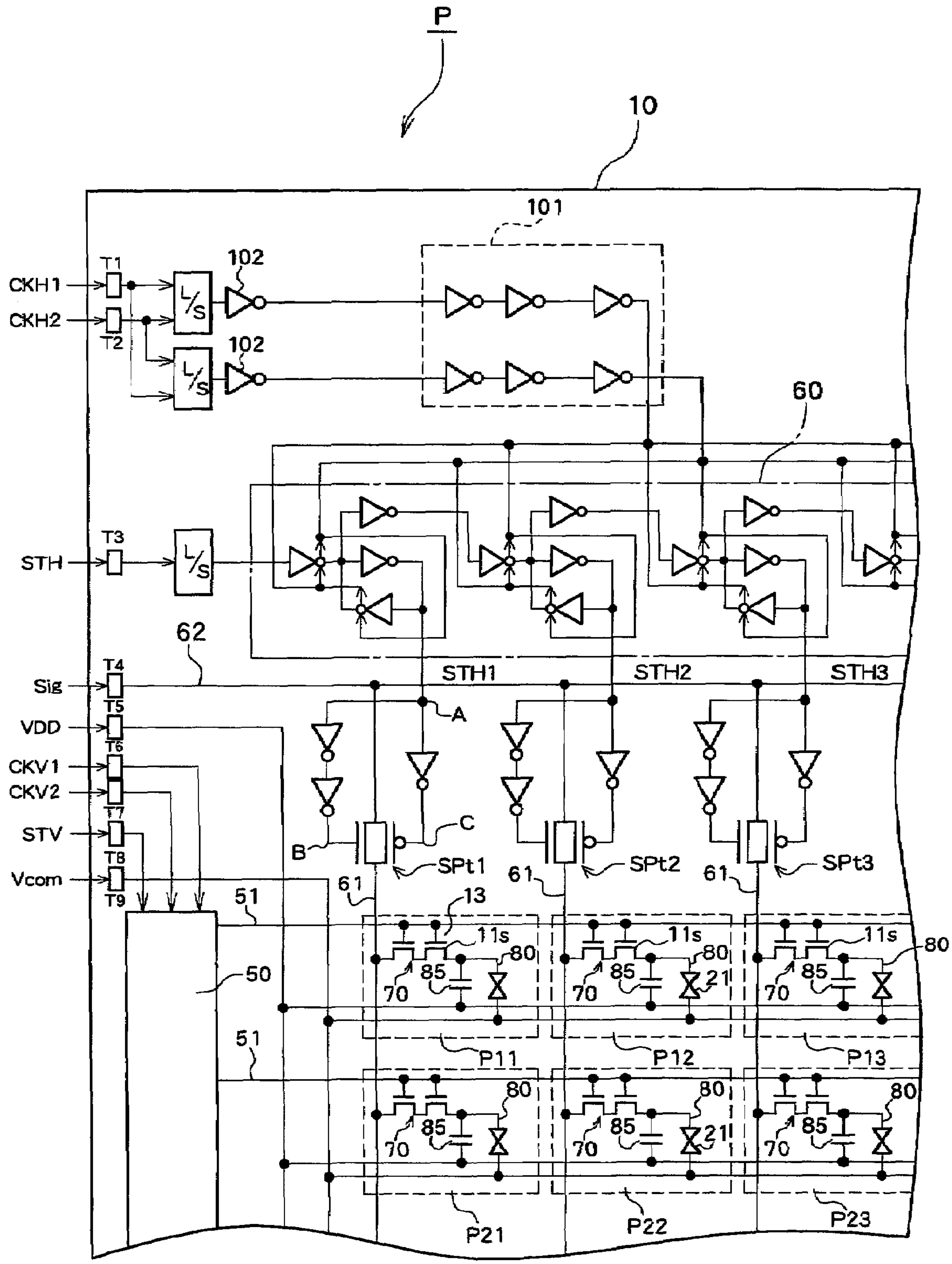
FIG. 1 is an equivalent circuit diagram of a liquid crystal display device according to a prior art.
Figure 2:
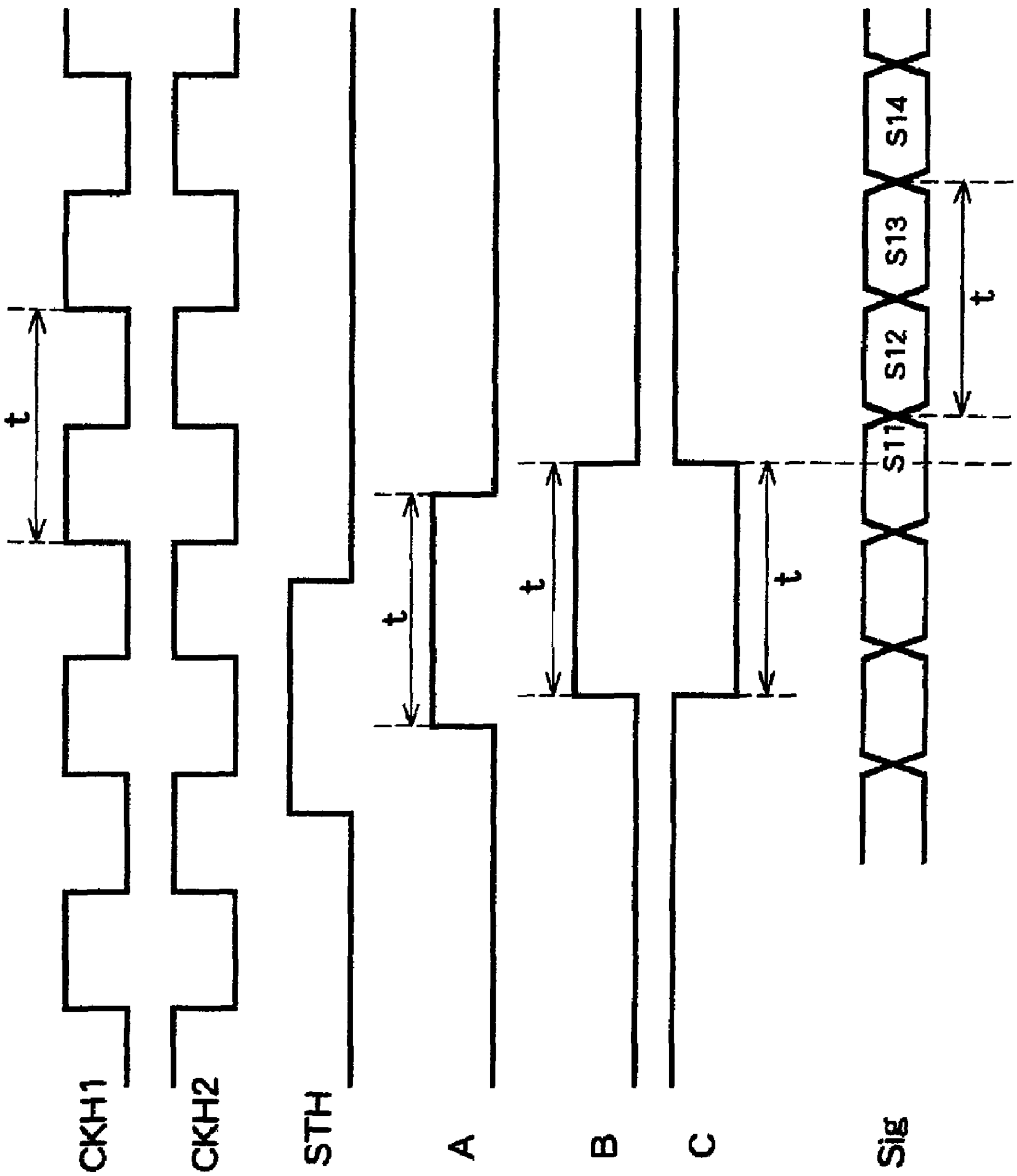
FIG. 2 is a timing chart at each point in the liquid crystal display device according to a prior art.

With the structure shown in FIG. 3, by selecting an inverter circuit as required for obtaining a necessary delay time, the sampling timing can be delayed such that the sampling can be performed in a state where the video signal line is sufficiently charged. Thus, desirable display can be obtained. This differs from the example shown in FIG. 2 where a video signal is sampled by the sampling TFT at timing at which the video signal line 62 is not sufficiently charged by the video signal Sig.

FIGS. 5A to 5E illustrate example structures of the inverter circuit 100 in each of which electrically independent inverter circuits 111 are selected and connected.

Figure 5A:
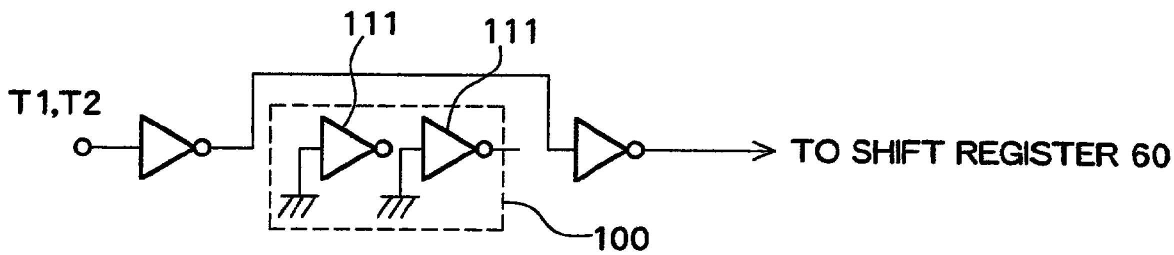
FIGS. 5A, 5B, 5C, 5D, and 5E are diagrams illustrating various methods of connecting inverter circuits of a video display device according to the present invention.
Figure 5B:
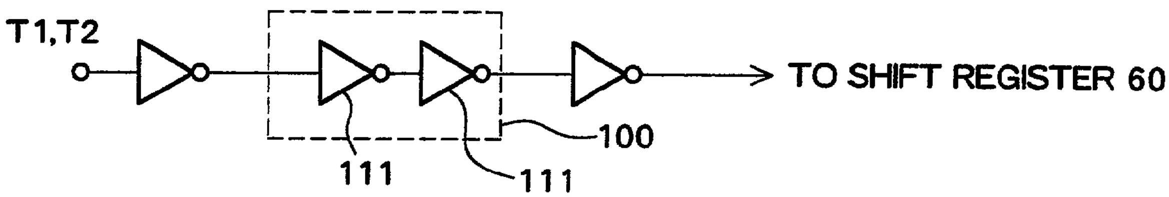

FIG. 5A illustrates an example structure in which two inverter circuits are formed electrically independent from each other. In this example, however, no inverter circuits 111 for use in timing adjustment are selected. FIG. 5B illustrates an equivalent circuit in which the two inverter circuits shown in FIG. 5A are connected between the external clock input sections T1, T2 and the shift register. The thus-connected inverter circuits are formed simultaneously with the formation of the switching TFT which constitutes a driving circuit for the display region and the peripheral region in the video display device. Further, a pattern for connecting these inverter circuits is adopted in the mask pattern used for the process of forming the source and drain electrodes and the lines of the switching TFT, so that, based on this pattern, the inverter connection lines are formed simultaneously with the formation of these electrodes and lines to thereby connect the desired inverter circuits.

Figure 5C:
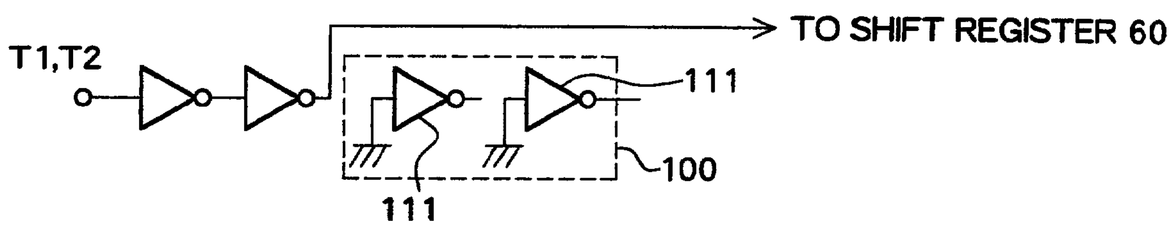

FIG. 5C illustrates an example wherein electrically independent inverter circuits are formed. No inverter circuits used for delay time adjustment are selected or connected.

Figure 5D:
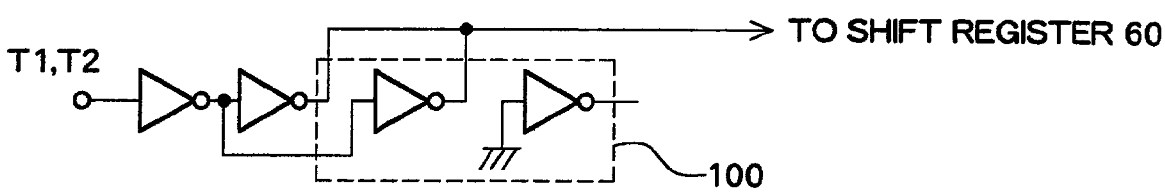
Figure 5E:
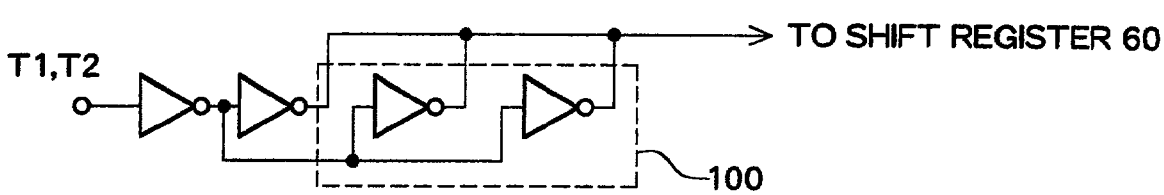

In FIGS. 5D and 5E, the same inverter circuits as in FIG. 5C are formed. In this example, however, a plurality of inverter circuits are connected in parallel within the signal path, as shown in the drawings. This connection is achieved by simply using a mask for connecting one or two inverter circuits as a pattern mask for the lines and electrodes of the TFT.

When two or three inverter circuits are connected in parallel as described above, the transistor size can be electrically changed (namely, the load of a circuit can be changed), an effect which cannot be obtained when only one inverter circuit is used. Assuming that, for example, the channel length is fixed to 6 $\mu$m, the channel width of an n-channel is 50 $\mu$m, and the channel width of a p-channel is 75 $\mu$m, the sampling timing of a video signal can be delayed by 10 nSec.

Figure 6A:
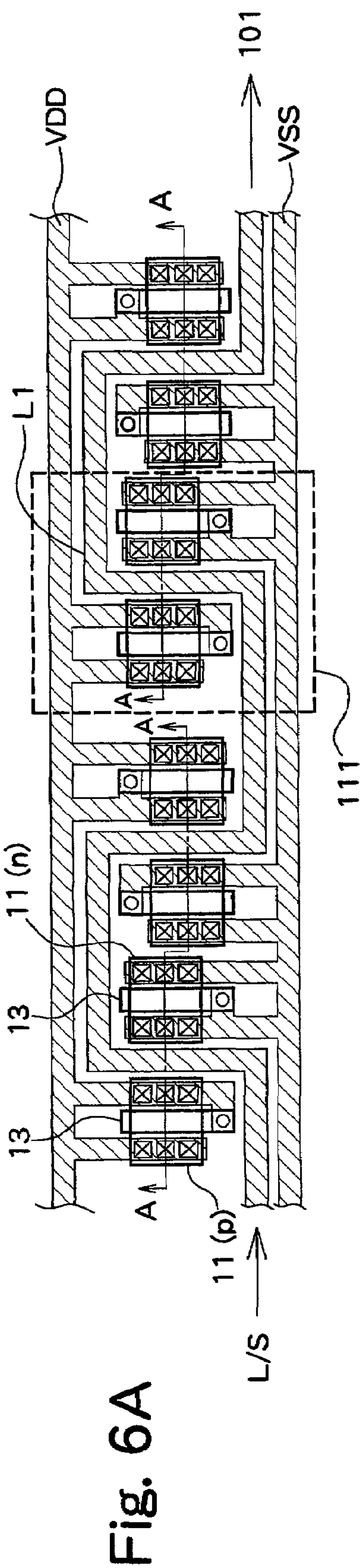
FIGS. 6A, 6B, 6C, 6E, and 6F are diagrams illustrating various methods of connecting inverter circuits of a video display device according to the present invention.
Figure 6B:
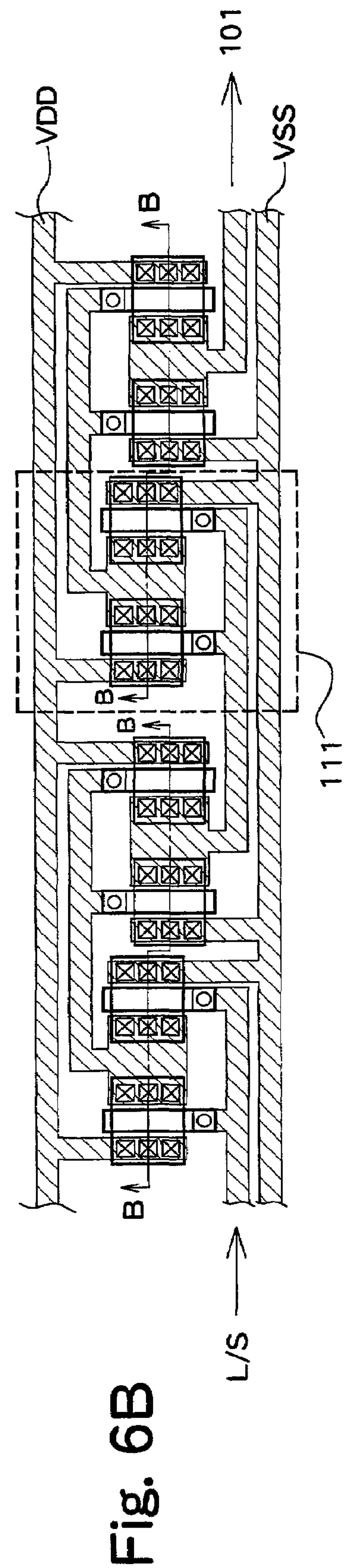
Figure 6C:
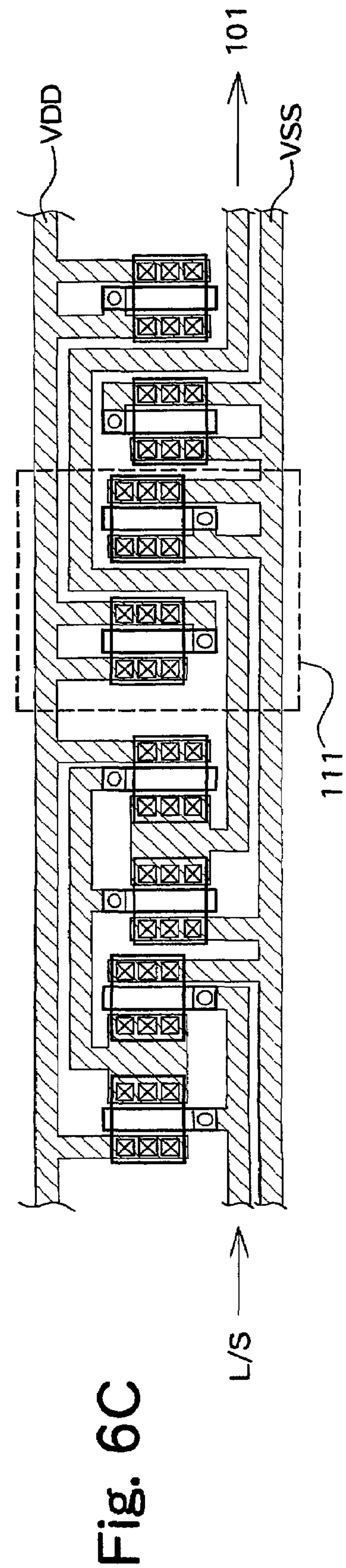
Figure 7A:
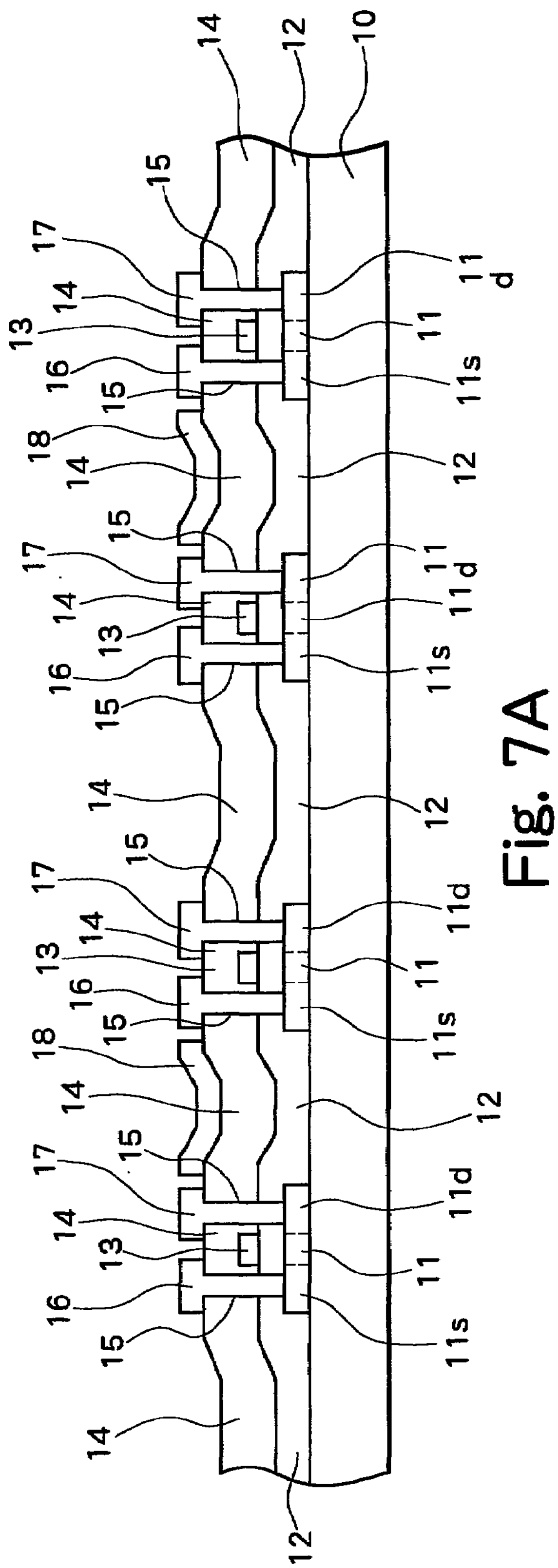
FIGS. 7A and 7B are cross sectional views of an inverter circuit of a video display device of the present invention.
Figure 7B:
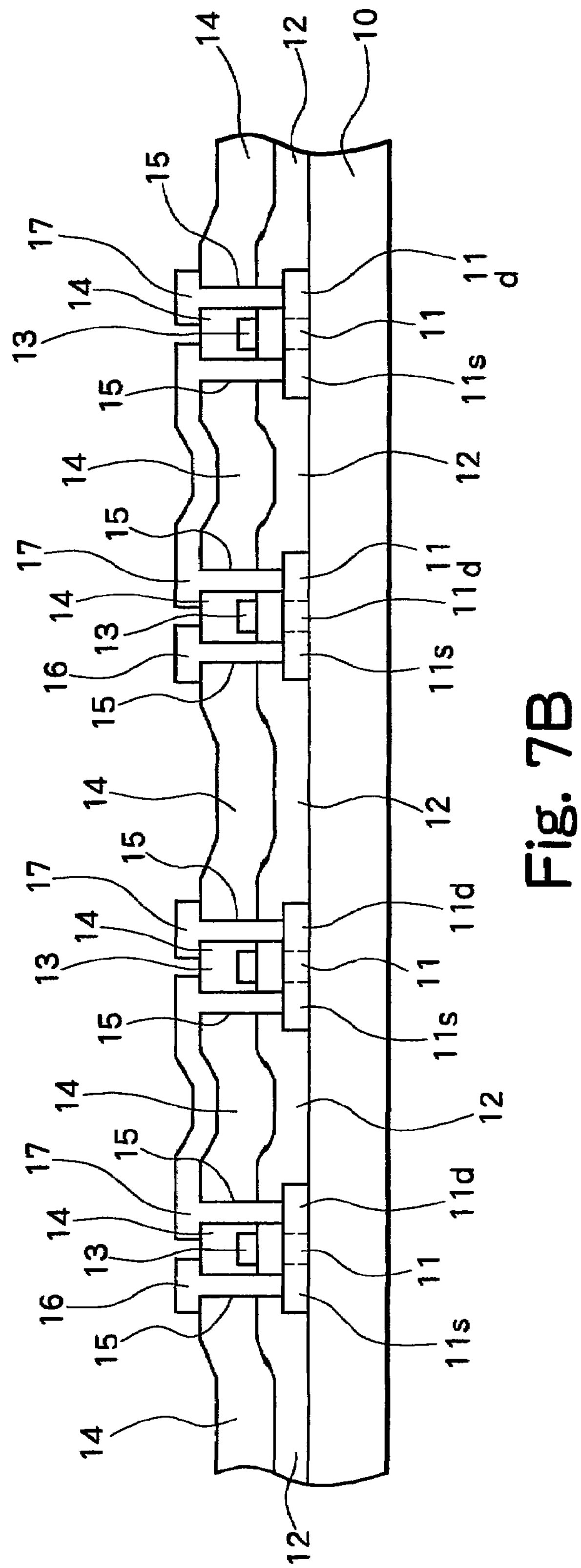

FIGS. 6A to 6C illustrate arrangement patterns of the inverter circuit of the video display device according to the present invention. FIG. 7A is a cross sectional view taken along line A—A of FIG. 6A, and FIG. 7B is a cross sectional view taken along line B—B of FIG. 6B. In the example patterns shown in FIGS. 6A to 6C, four inverter circuits are provided on a substrate.

In FIG. 6A, none of the inverter circuits 111 are connected through a connection line pattern formed of, for example, aluminum, which is hatched, in particular through a connection line (a signal transmission line) L1 connecting from the level shifter (L/S) to the buffer circuit. In the device shown in FIG. 6B, all the inverter circuits are connected through the connection line pattern. Of four inverter circuits shown FIG. 6C, the two inverter circuits at the left side of the drawing are connected through the connection line pattern. In each of FIGS. 6A to 6C, an output signal from the inverter circuit for shaping, which is connected with L/S, is applied to the line L1, and is further output to the buffer circuit 101 via each inverter circuit connected with the L1. At the top and bottom portions of each drawing, power source voltages VDD and VSS for the inverter circuit are applied.

When required sampling of a video signal is not possible in a video display device from a certain manufacturing lot, such as when the sampling timing for a video signal is too early and the sampling is performed at timing when the video signal line is not sufficiently charged by the video signal, in the next manufacturing lot, inverter circuits of video display devices are appropriately selected and connected through the connection line pattern, so that the timing of sampling is delayed. More specifically, it is assumed that, in a manufacturing lot, display devices adopt a pattern as shown in FIG. 6A, in which, although TFTs used for inverters are formed on the substrate, all the inverter circuits remain insulated from the signal path and unselected, and that the timing for sampling is too early in a display device from this lot. In such a case, when manufacturing display devices in the next manufacturing lot, the connection line pattern for selecting four inverter circuits (the hatched region in FIG. 6B) is adopted in place of the connection line pattern for non-selecting (the hatched region in FIG. 6A), so that the four inverter circuits are disposed within the signal path. Alternatively, the connection line pattern for selecting two inverter circuits shown as a hatched region in FIG. 6C is adopted, to thereby arrange the two inverter circuits within the signal path. By connecting inverter circuits within the signal path in this manner, the delay time for a signal (in this example, a clock signal CKH1, CKH2) is adjusted. Here, the number of inverter circuits to be selected may be determined in such a manner that the sampling can be performed at timing when the video signal line is sufficiently charged by the video signal. It should be noted that any number of inverter circuits which are electrically independent from each other may be provided on the substrate, as long as they can cope with the delay or advance of the sampling timing in each manufacturing lot.

In FIGS. 6A to 6C, each "X" indicates a contact point where each active layer indicated by numeral 11 contacts with each electrode and connection line made of aluminum which and indicated as a hatched region. Although different connection patterns are adopted in FIGS. 6A to 6C, these Xs are located at the corresponding positions in these drawings. Further, each contact point where each gate electrode of the TFT which is formed of, for example, chromium (Cr) contacts with the above-described connection line is indicated with "O". As in the case of the contact point between the active layer and the connection line, "O"s are also located at the corresponding positions in FIGS. 6A to 6C, although different connection patterns are used in these drawings. Namely, regardless as to whether or not an inverter circuit is connected with the signal path, contact between the active layer and the connection line, and contact between the line functioning as the gate and the connection line are formed.

Accordingly, it is possible for connection of the required number of delay circuits, having an inverter structure in this embodiment, to be done simultaneously with the formation of the drain signal line of the TFT forming a driving circuit within the display pixel region and in the peripheral region. More specifically, presently, when a method of producing a new TFT which constitutes an inverter circuit is adopted in order to change the number of delay circuits, it is necessary to change the mask patterns used for all the processes up to the process of forming the contact points so as to produce the new TFT. According to the present invention, on the other hand, it is only necessary to use a mask pattern having a connection pattern which connects the desired inverter circuit to the signal path, in the process of forming the electrodes and lines of the TFT which is a switching element constituting a driving circuit within the display region and the peripheral region. Thus, the delay time can be adjusted by simply changing the connection line patterns, without increasing the number of manufacturing process, and without changing the order of process.

As shown in FIGS. 6A, 6B and 6C, in addition to the contact points indicated with an "X" or "O", the gate electrodes 13 (shown as blank lines) formed of Cr or the like in the present invention are also formed at corresponding positions in these drawings. In addition, the position of a TFT which constitutes an inverter circuit, more specifically, the position of an island-shaped active layer of the TFT is the same in an inverter circuit, regardless as to whether or not the inverter circuit is connected to the signal transmission line (L1). Because the positions of the active layer and the contact points are thus fixed on an inverter circuit regardless as to whether or not the inverter circuit is connected to the signal path, in the present embodiment, an n-ch TFT and a p-ch TFT which together form one inverter circuit are arranged such that active layers of the respective TFTs are spaced from each other at an interval which allows the signal transmission line L1 to be arranged therein. In an inverter circuit which is not connected to the signal transmission line, the signal transmission line L1 passes through between the active layers of the n-ch and p-ch TFTs of each inverter circuit 111, as shown in FIG. 6A.

Figure 6D:
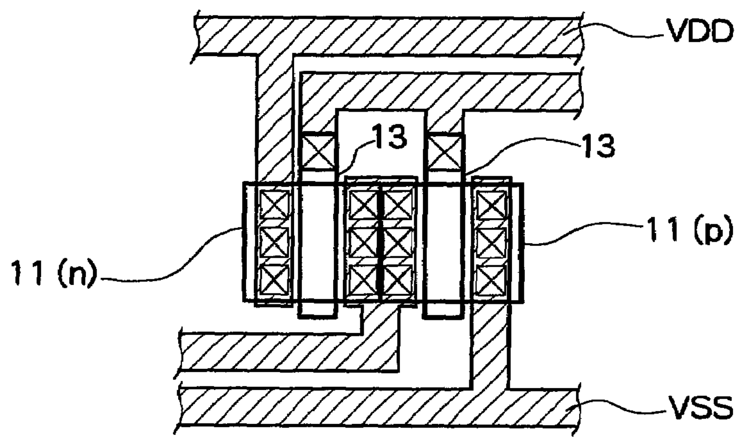
FIG. 6D is a diagram illustrating a general method of connecting inverter circuits.

Typically, when a plurality of inverter circuits are used as a delay circuit, a necessary number of inverter circuits are originally formed and connected in series. In this case, an n-ch TFT and a p-ch TFT forming one inverter circuit are arranged having a minimum interval therebetween, as shown in FIG. 6D. Therefore, when changing the necessary number of connection for inverter circuits, it is necessary to use a mask corresponding to the required number of connection in each manufacturing step for forming an inverter circuit.

According to the present invention, on the other hand, the positions of an inverter circuit and their contact points with lines and electrodes are fixed on the substrate regardless as to whether or not the inverter circuit is connected with the signal transmission line for a clock, as described above. It is therefore possible to change the number of connection for inverter circuits merely by changing the mask used in the process of forming lines (for example, a data signal line, VDD and VSS line and the signal transmission lien L1 of a display device) to a mask having the line patterns in accordance with the number of connection the inverter circuits.

Figure 6E:
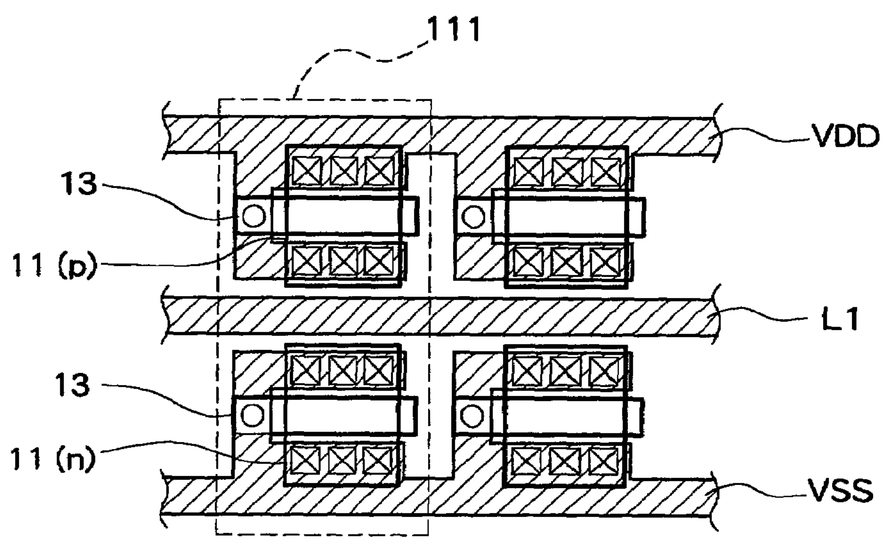
Figure 6F:
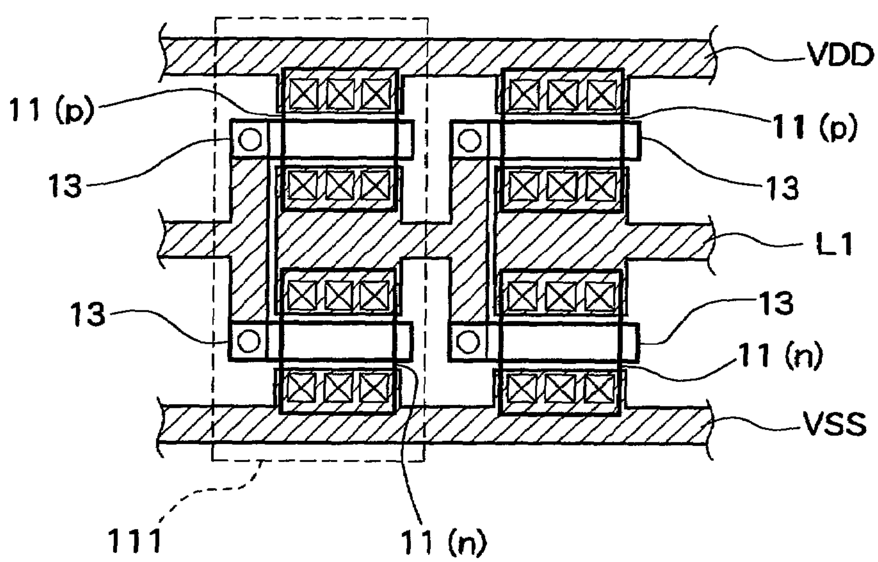

FIGS. 6E and 6F show another example arrangement of inverter circuits functioning as a delay circuit, one different from those shown in FIGS. 6A to 6C. All the inverter circuits shown in FIG. 6E are insulated from the signal transmission line L1, while all the inverter circuits shown in FIG. 6F are connected with the line L1. The arrangement in FIGS. 6E and 6F differs from that in FIGS. 6A to 6C in the direction of arrangement of the TFTs. More specifically, while the channel length direction of the TFTs coincides with the extending direction of the VDD and VSS lines in FIGS. 6A to 6C, the channel length direction of the TFTs is orthogonal to the extending direction of the VDD and VSS lines in FIGS. 6E and 6F. However, the arrangement of FIGS. 6E and 6F is similar to that of FIGS. 6A to 6C in that each TFT is formed between the VDD line and the VSS line which function as a power source of the inverter circuit, and in that an n-ch TFT and a p-ch TFT forming one inverter circuit are arranged such that active layers of the respective TFTs are spaced at an interval regardless as to whether or not the inverter circuit is connected with the signal transmission line L1. Further, similar to the arrangement of FIGS. 6A to 6C, with the arrangement of FIGS. 6E and 6F, the position where a TFT is formed and the position of contact with each electrode or each line does not change regardless of whether or not the inverter circuit is connected with the signal transmission line L1.

Of course, in any of the line pattern masks shown in FIGS. 6A to 6C, and 6E and 6F, the pattern of the electrode and line of the TFT constituting a driving circuit of the display region and the peripheral region is also drawn within the same mask.

Referring now to FIGS. 7A and 7B, a method of manufacturing the inverter circuit as described above will be described.

On an insulating substrate 10 such as a non-alkali glass substrate, a silica substrate, or the like, an amorphous silicon film (hereinafter referred to as "a-Si film") is formed using a plasma CVD method. The a-Si film is scanned and irradiated with XeCl excimer laser beam from the top surface, so that the a-Si film is melted and recrystallized to form a polycrystalline silicon film (hereinafter referred to as "p-Si film") 11. The p-Si film 11 is then formed into an island shape by means of photolithography and using a photo mask pattern, so that an active layer of a thin film transistor is provided.

Over the entire surface covering the p-Si film 11, an SiN film and $SiO_2$ film are sequentially disposed in a laminate structure using a CVD method to form a gate insulating film 12.

On the gate insulating film 12, gate electrodes 13 made of a refractory metal such as Cr and W are formed with photolithography using a photo mask pattern having a gate electrode pattern. Then, using the gate electrode 13 as a mask, ion is doped in the region corresponding to the source 11*s* or the drain old of the active layer. When an n-channel TFT is formed, phosphor (P) is introduced. When a p-channel TFT is formed, boron (B) is introduced.

Then, an interlayer insulating film 14 in which an $SiO_2$ film, an SiN film, and an $SiO_2$ film are sequentially disposed in a laminated structure is formed. At the portions of the interlayer insulating film 14 corresponding to the source 11*s* and the drain 11*d*, respectively, contact holes 15 are formed. In this case, the contact holes 15 are formed by means of the photolithography and using a photo mask pattern having a pattern for forming the contact holes. Then, aluminum (Al) is sputtered over the interlayer insulating film 14 including the contact holes using an appropriate sputtering method. This Al is then patterned by means of the photolithography and using a photo mask pattern having patterns of a source electrode 16, a drain electrode 17, and a line 18, to thereby form the source electrode 16, the drain electrode 17, and the line 18. Finally, over the source and drain electrodes 16, 17 and the line 18, an insulating film is formed for surface insulation. It should be noted that one of the VDD line or the VSS line also functions as the source and drain electrodes 16, 17 of FIGS. 7A and 7B, depending on the connection pattern of the inverter circuits, as shown in FIGS. 6A to 6C. Of course, the connection line for connecting a desired number of inverter circuits is also formed simultaneously with the formation of these electrodes and lines.

In this manner, the inverter circuit is completed.

It should be understood that simultaneously with the formation of the peripheral driving circuit including the inverter circuits as described above, the TFT 70 (for pixel switching) which is disposed in the display region of the video display device is also formed (see FIG. 3).

According to the structure of the present invention, depending on the delay conditions, there exists an inverter circuit which is formed on the substrate but is not connected with the signal path. Even in such a case, as shown in FIG. 6A, the inverter circuit which is not connected with the signal path is electrically connected with the VDD line or the VSS line and an off voltage is applied to the gate electrode 13 in each of the TFTs in the example of FIG. 6A, so that unexpected malfunction can be reliably prevented.

As described above, a pattern mask is used in each process step when forming a TFT of the video display device.

Conventionally, when changing the number of inverter circuits in order to adjust the sampling timing of a video signal, it is necessary to prepare additional pattern masks so as to additionally form a different number of inverter circuits. According to the present invention, on the other hand, regardless of whether or not the inverter circuit is connected with the signal path, a plurality of inverter circuits are pre-formed using pattern masks with a pattern for producing a plurality of electrically independent inverter circuits. Accordingly, in order to change the number of inverter circuits to be selected for delay time adjustment, it is only necessary to prepare, in advance, pattern masks having different patterns for connecting the inverter circuits, by the number corresponding to the expected number of connection for inverter circuits. Namely, by pre-producing a plurality of inverter circuits and preparing pattern masks for connecting these inverter circuits as required, it is not necessary to prepare pattern masks which are required for the processes prior to the process of forming the connection line pattern.

How the number of the inverter circuits thus formed are selected as necessary and how theses inverter circuits are connected will next be described.

FIG. 7A is a cross sectional view taken along line A—A of FIG. 6A and illustrates a case where none of the inverter circuits are connected with the signal path. FIG. 7B is a cross sectional view taken along line B—B of FIG. 6B and illustrates a case wherein all the inverter circuits which are shown in the drawing are connected with the signal path. It should be noted that the inverter circuits shown in FIGS. 6E and 6F have sectional structures similar to those shown in FIGS. 7A and 7B, respectively.

When connecting the inverter circuits, a mask having a pattern for connecting the necessary inverter circuits is used as the photo mask pattern having the source and drain electrodes patterns and the line patterns formed therein, whereby a required number of n-channel TFTs and p-channel TFTs which constitute the inverter circuits are connected. This makes it possible to control delay in the sampling timing to a desired amount.

As described above, a mask pattern for forming a plurality of electrically independent inverter circuits is provided in the photo mask patterns having the respective patterns used in the respective manufacturing processes for forming a switching element of a driving circuit of the display region and the peripheral region. Thus, when the switching element of the driving circuit for the display region and the peripheral region is formed, the plurality of electrically independent inverter circuits are formed simultaneously.

Then, by having provided the necessary inverter connection line on the mask pattern used for forming the electrodes and lines of the switching element, the desired inverter circuits are connected simultaneously with the formation of the driving circuit for the display region and the peripheral region.

Thus, it is possible to easily select and connect the inverter circuits between the external clock input sections and the shift register simply by switching the pattern masks having different patterns for connecting a desired number of inverter circuits in accordance with the delay of the sampling timing. It is also possible to adjust the delay time. As a result, preferable sampling timing can be obtained and turbulence of display can be eliminated.

As described above, according to the video display device of the present invention, when the sampling timing of a video signal varies among manufacturing lots of a video display device, the number of inverter circuits, namely a delay time, can be selected for each lot so as to obtain appropriate timing delay, and the selected inverter circuits can be connected using a photo mask pattern having a line pattern for connecting these inverter circuits. As a result, it is possible to sample a video signal at proper timing and therefore charge the video signal line to a sufficient potential, so that desirable display can be obtained.

Although the above embodiment describes an example in which a delay time is increased, when the connection pattern is changed from that shown in FIG. 6B to that shown in FIG. 6C, namely when a delay time is decreased, it is also possible to adjust the sampling timing by decreasing the number of inverters to be selected.

Further, delay time of the above-described inverter circuit to be formed on a substrate may differ according to the size of TFTs forming the inverter circuit. Specifically, when it is desired to delay the sampling timing by a significant amount within one inverter circuit, such delay can be achieved by increasing the channel width of the inverter circuit. Conversely, a decrease in the delay amount can be achieved by decreasing the channel width.

Figure 8A:
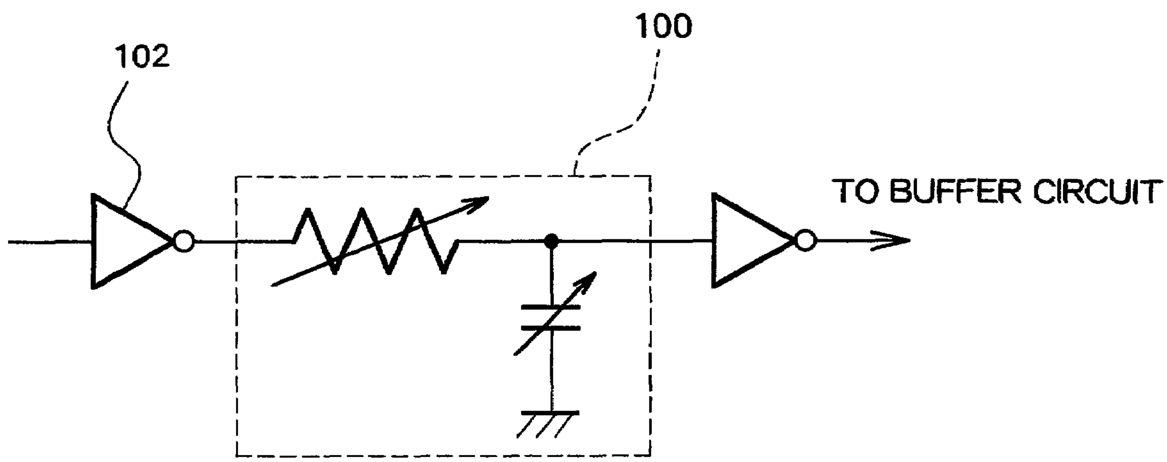
FIGS. 8A, 8B and 8C are equivalent circuit diagrams showing a delay time adjusting circuit in accordance with another embodiment of the present invention.
Figure 8B:
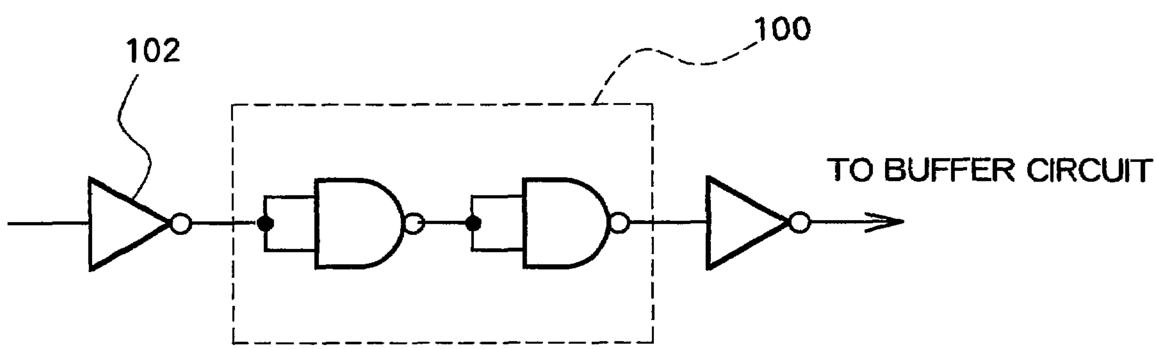
Figure 8C:
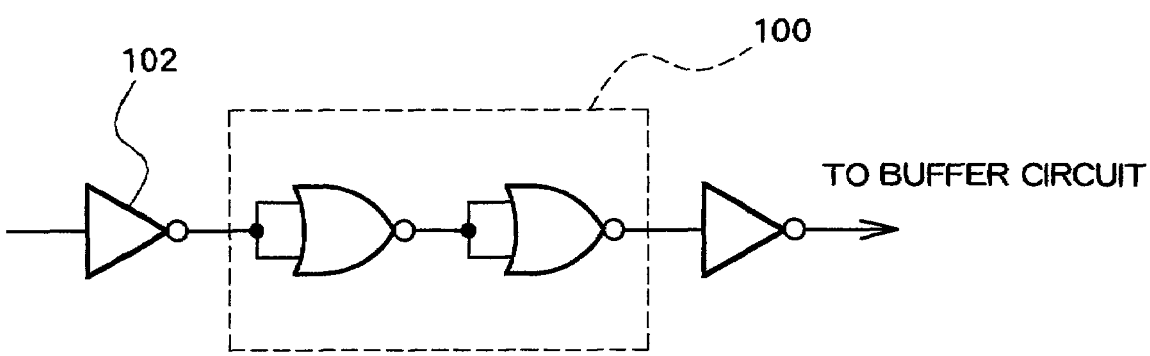

Further, although the above embodiment describes an example in which an inverter circuit is used as a delay circuit, the present invention is not limited to that example, but can also be implemented in the following structures. Specifically, as shown in FIG. 8A, a resistor and a capacitor are connected. By adjusting values of the resistance and capacitance thereof, the delay time can be adjusted. Alternatively, as shown in FIG. 8B, it is also possible to adjust the delay time by replacing the inverter circuit with an NAND gate circuit. Further, an NOR gate circuit can also be used so as to adjust the delay time, as shown in FIG. 8C.

Further, in the present invention, "a delay time" may refer not only to the delay in the sampling timing but also to the advance in the sampling timing.

While the preferred embodiment of the present invention has been described using specific terms, such description is for illustrative purposes only, and it is to be understood that changes and variations may be made without departing from the spirit or scope of the appended claims.

What is claimed is:

1. A display device in which a display signal externally transferred in sequence is sampled based on an external clock signal and is supplied to each of pixels arranged in a matrix for causing each pixel to perform display, said display device comprising:

a sampling signal generating circuit for generating a sampling signal used for sampling said display signal, based on said external clock signal; and at least one clock delaying circuit disposed between said sampling signal generating circuit and a terminal for supplying said external clock signal and having a function of delaying said external clock signal, wherein said at least one clock delaying circuit is connected to a signal transmission line for supplying said external clock signal to said sampling signal generating circuit, said signal transmission line and a connection line connecting to said signal transmission line being formed using a pattern mask in accordance with the required number of connections for the delaying circuit in the process for forming said signal transmission line and said connection line, wherein said clock delaying circuit is a inverter circuit formed by an n-type thin film transistor and a p-type thin film transistor which are connected in a complementary manner, and said n-type thin transistor and said p-type thin film transistor forming one inverter circuit are arranged such that active layers of said n-type and p-type transistor are spaced with an interval which is larger than the width of said signal transmission line.

2. A display device according to claim 1, wherein a switching element is formed in each of said pixels, and an electrode and a line connected with said switching element are formed from the same material as that used for said signal transmission line and the connection line of said at least one clock delaying circuit.

3. A display device in which a display signal externally transferred in sequence is sampled based on an external clock signal and is supplied to each of a plurality of pixels arranged in a matrix, for causing each pixel to generate a display, said display device comprising:

a sampling signal generating circuit for generating a sampling signal used for sampling said display signal, based on said external clock signal; and at least one clock delaying circuit disposed between said sampling signal generating circuit and a terminal for supplying said external clock signal, said at least one clock delaying circuit having a function of delaying said external clock signal, wherein at least one of said at least one clock delaying circuit is insulated from a signal transmission line which is provided for supplying said external clock signal to said sampling signal generating circuit.

4. A display device according to claim 3, wherein said signal transmission line is arranged such that the signal transmission line passes though a region where said at least one clock delaying circuit which is not electrically connected with said signal transmission line is formed, with said signal transmission line remaining insulated from said delaying circuit.

5. A display device according to claim 4, wherein said clock delaying circuit is an inverter circuit formed by an n-type thin film transistor and a p-type thin film transistor which are connected in a complementary manner, and said n-type thin film transistor and said p-type thin film transistor forming one inverter circuit are arranged such that active layers of said n-type and p-type transistors are spaced at an interval which is larger than the width of said signal transmission line.

6. A display device according to claim 4, wherein said clock delaying circuit is an inverter circuit formed by an n-type thin film transistor and a p-type thin film transistor which are connected in a complementary manner, and in a region where said clock delaying circuit which is insulated from said signal transmission line is formed, said signal transmission line is arranged in a gap between active layers spaced from each other, of said n-type thin film transistor and said p-type thin film transistor forming one inverter circuit.

7. A display device according to claim 4, wherein said clock delaying circuit is an inverter circuit formed by an n-type thin film transistor and a p-type thin film transistor which are connected in a complementary manner, and said n-type thin film transistor and said p-type thin film transistor for said at least one clock delaying circuit which is not electrically connected with said signal transmission line are respectively connected with a low voltage side power source line and a high voltage side power source line.

8. A display device in which a display signal externally transferred in sequence is sampled based on an external clock signal and is supplied to each of a plurality of pixels arranged in a matrix for causing each pixel to generate a display, said display device comprising:

a sampling signal generating circuit for generating a sampling signal used for sampling said display signal, based on said external clock signal; and at least one clock delaying circuit having a function of delaying said external clock signal, said at least one clock delaying circuit being connected with a signal transmission line between said sampling signal generating circuit and a terminal for supplying said external clock signal, wherein in each said clock delaying circuit so provided, a plurality of elements forming each circuit are spaced at an interval which is larger than the width of said signal transmission line.

9. A display device according to claim 8, wherein said clock delaying circuit is an inverter circuit formed by an n-type thin film transistor and a p-type thin film transistor which are connected in a complementary manner, and said n-type thin film transistor and said p-type thin film transistor forming one inverter circuit are arranged such that active layers of said n-type and p-type transistors are spaced at an interval which is larger than the width of said signal transmission line.

10. A display device according to claim 8, wherein the transmission line is formed in said interval between said elements and in accordance with a pattern mask.

* * * * *